(12) United States Patent
Takahashi

(10) Patent No.: US 10,111,317 B2
(45) Date of Patent: Oct. 23, 2018

(54) PRINTED CIRCUIT BOARD FOR TRANSMITTING DIGITAL SIGNALS

(71) Applicant: CANON KABUSHIKI KAISHA, Tokyo (JP)

(72) Inventor: Yasuhiro Takahashi, Ageo (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 14/782,255

(22) PCT Filed: Mar. 20, 2014

(86) PCT No.: PCT/JP2014/001644
§ 371 (c)(1),
(2) Date: Oct. 2, 2015

(87) PCT Pub. No.: WO2014/162685
PCT Pub. Date: Oct. 9, 2014

(65) Prior Publication Data
US 2016/0037626 A1 Feb. 4, 2016

(30) Foreign Application Priority Data

Apr. 5, 2013 (JP) .................................. 2013-079105

(51) Int. Cl.
*H01P 3/08* (2006.01)
*H05K 1/02* (2006.01)
*H01P 1/203* (2006.01)

(52) U.S. Cl.
CPC ......... *H05K 1/0228* (2013.01); *H01P 1/2039* (2013.01); *H05K 1/0243* (2013.01);
(Continued)

(58) Field of Classification Search
CPC ..... H01P 1/2039; H01P 1/212; H05K 1/0228; H05K 1/0243; H05K 2201/09236;
(Continued)

(56) References Cited

U.S. PATENT DOCUMENTS

2011/0068882 A1* 3/2011 Honda ................... H01P 1/2039
333/202

FOREIGN PATENT DOCUMENTS

| JP | 2001-068905 A | 3/2001 |
| JP | 2004-015535 A | 1/2004 |

(Continued)

*Primary Examiner* — Robert Pascal
*Assistant Examiner* — Kimberly Glenn
(74) *Attorney, Agent, or Firm* — Canon U.S.A., Inc. IP Division

(57) ABSTRACT

A printed circuit board includes a printed wiring board and a transmission circuit implemented on the printed wiring board and transmitting digital signals. The printed wiring board connected to the transmission circuit includes a main wiring pattern transmitting digital signals and a first wiring pattern having a connection end connected to the main wiring pattern and an open end. The printed wiring board further includes a second wiring pattern having a grounded end and an open end and extending in a direction in which the first wiring pattern extends. The second wiring pattern is disposed such that the grounded end of the second wiring pattern is disposed adjacent to the connection end or the open end of the first wiring pattern. By this, a printed circuit board capable of suppressing EMI is provided while increase in size of the printed wiring board is avoided.

19 Claims, 12 Drawing Sheets

(52) U.S. Cl.
CPC . *H05K 1/0239* (2013.01); *H05K 2201/09236* (2013.01); *H05K 2201/09781* (2013.01); *H05K 2201/10189* (2013.01); *H05K 2201/10689* (2013.01)

(58) Field of Classification Search
CPC .......... H05K 2201/09781; H05K 2201/10189; H05K 2201/10689; H03F 1/56; H03F 3/601; H03F 200/387
USPC ........................................................ 333/204
See application file for complete search history.

(56) References Cited

FOREIGN PATENT DOCUMENTS

| | | | |
|---|---|---|---|
| JP | 2006-129215 | A | 5/2006 |
| JP | 2007-251403 | A | 9/2007 |
| JP | 2011-066822 | A | 3/2011 |
| JP | 2011-160428 | A | 8/2011 |

* cited by examiner

[Fig. 1A]
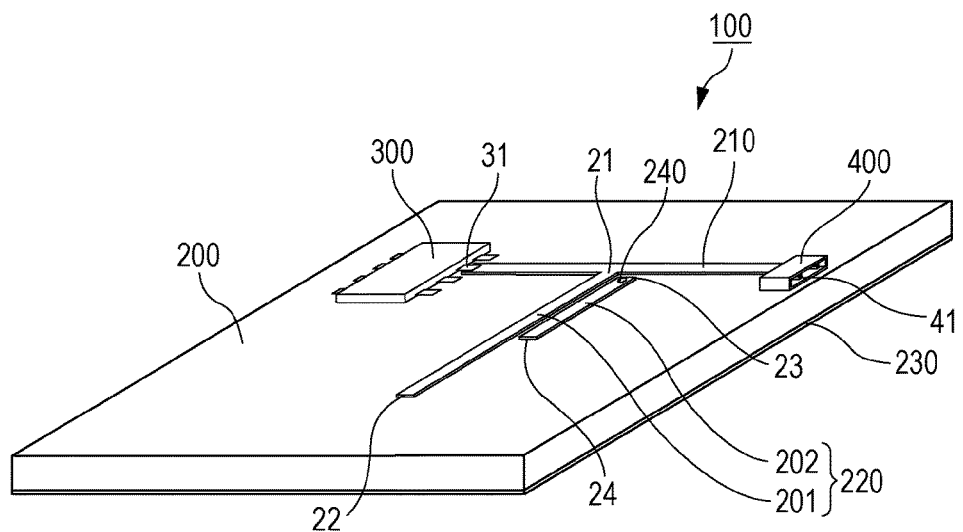
[Fig. 1B]
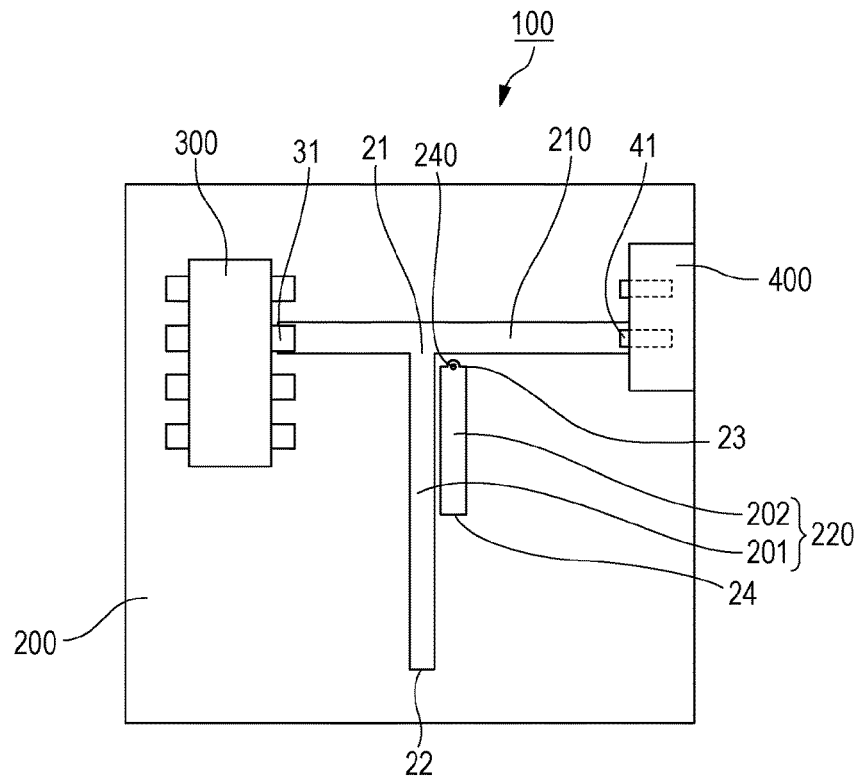

[Fig. 2A]
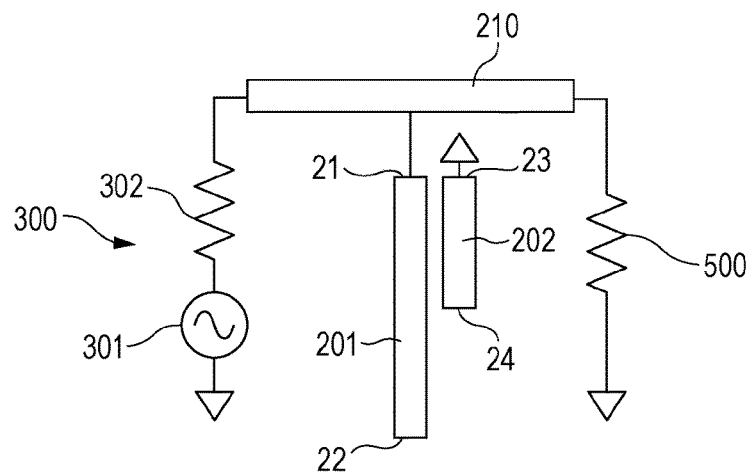
[Fig. 2B]
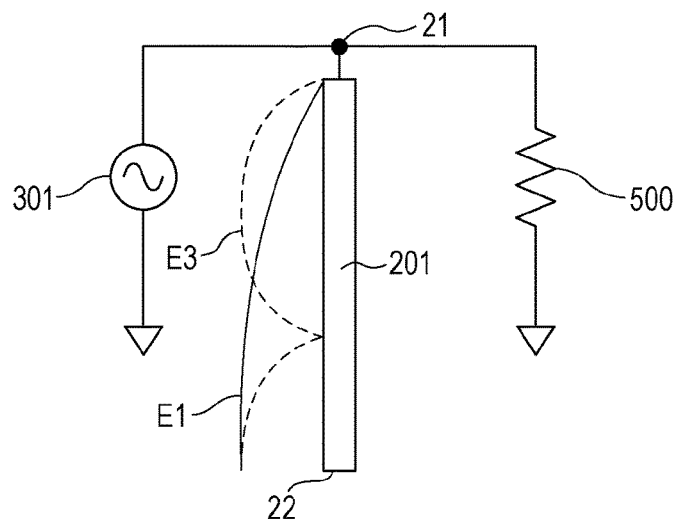
[Fig. 2C]
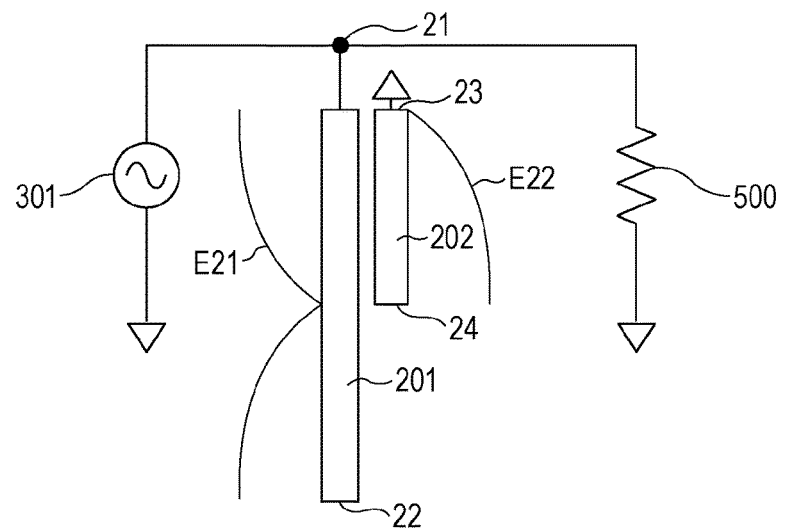

[Fig. 3A]
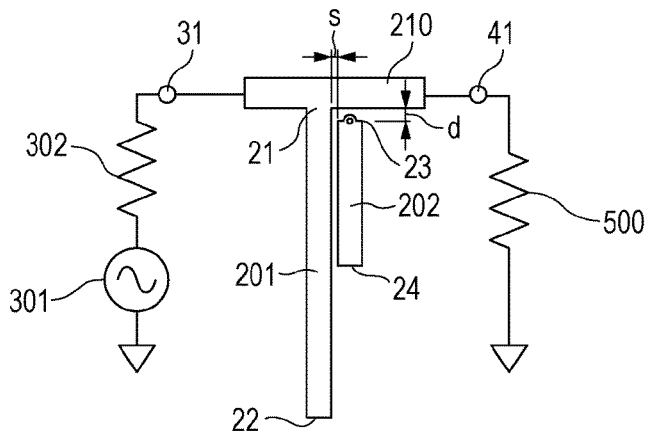
[Fig. 3B]
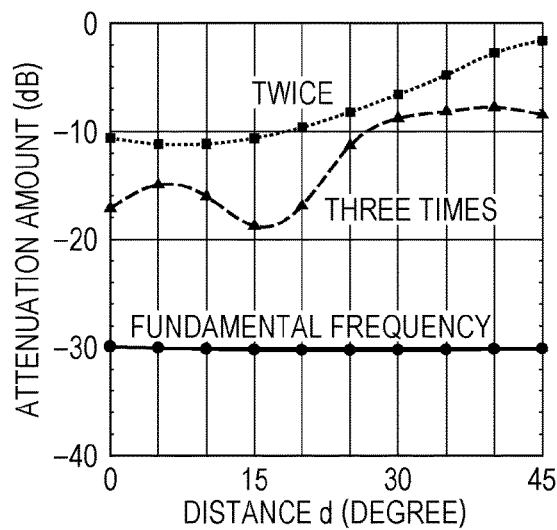
[Fig. 3C]
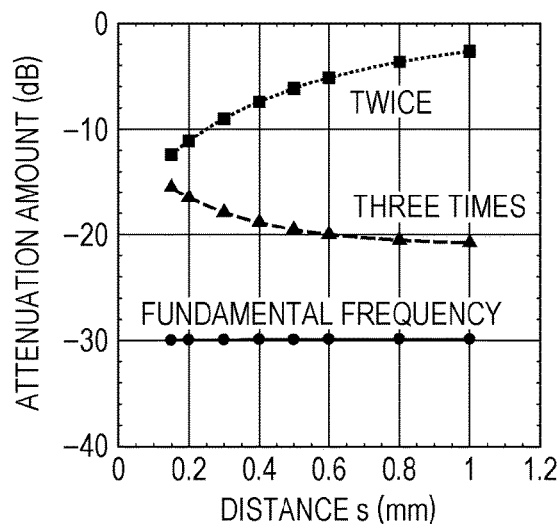

[Fig. 4A]
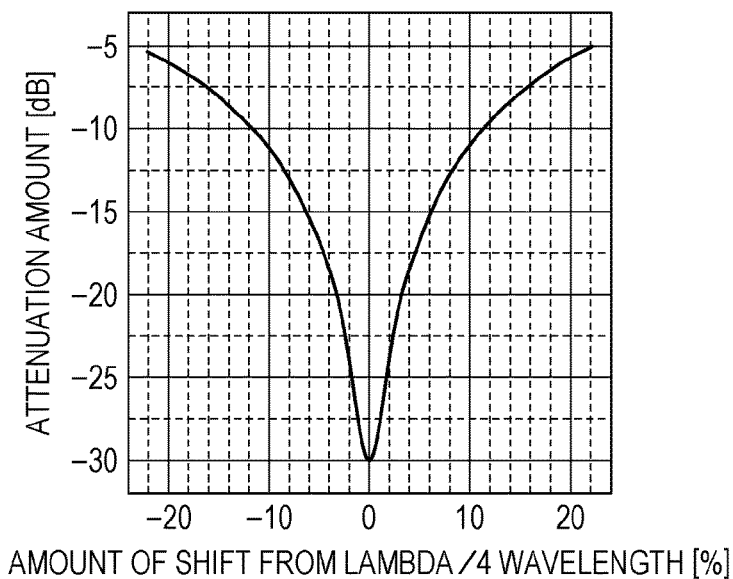
[Fig. 4B]
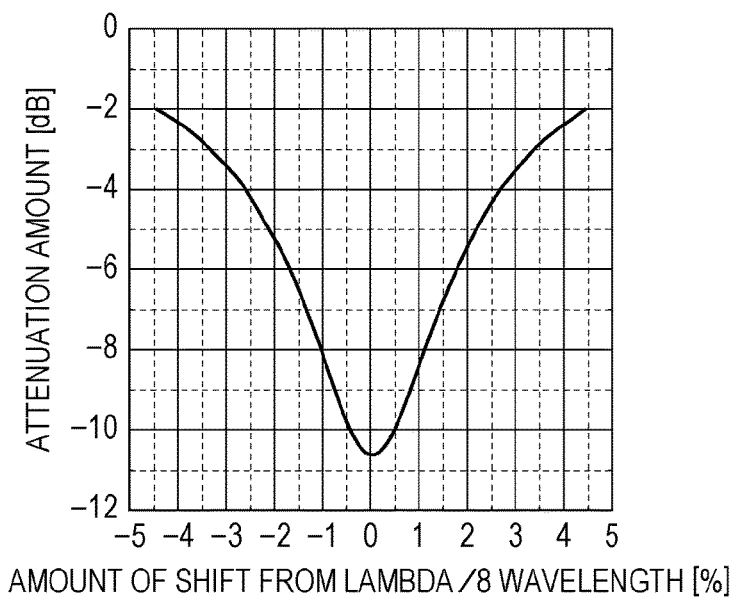

[Fig. 5]
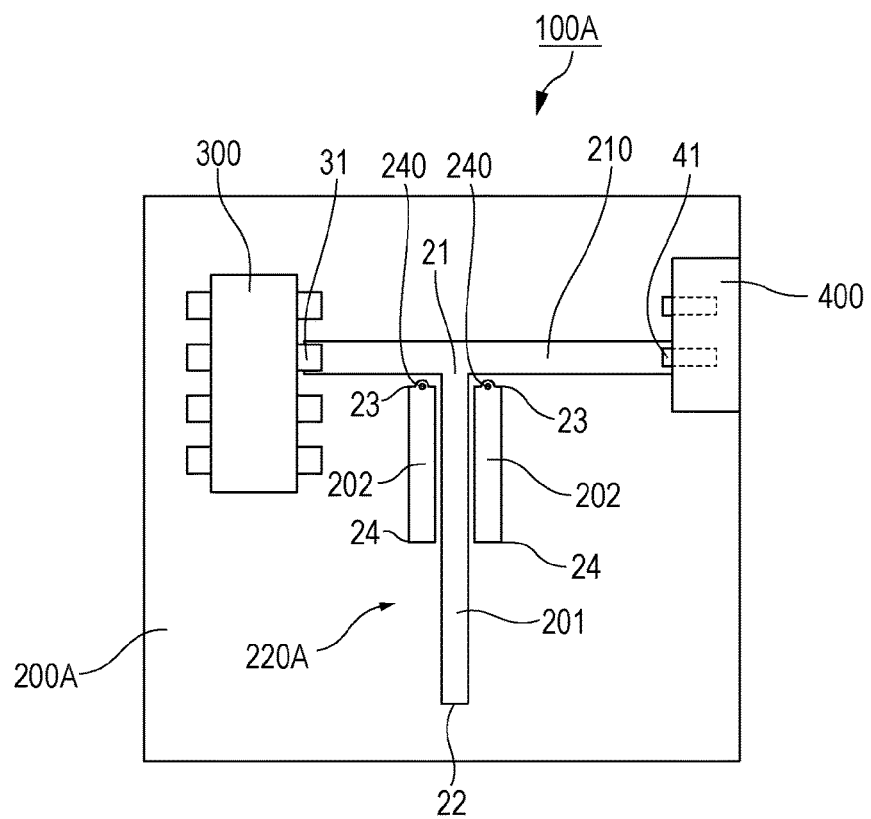

[Fig. 6A]
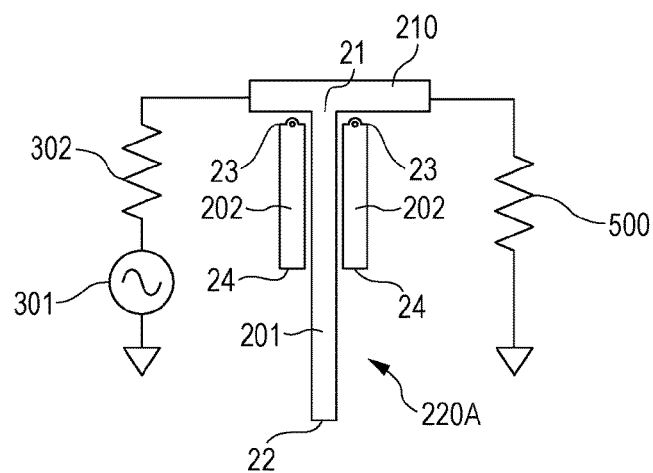
[Fig. 6B]
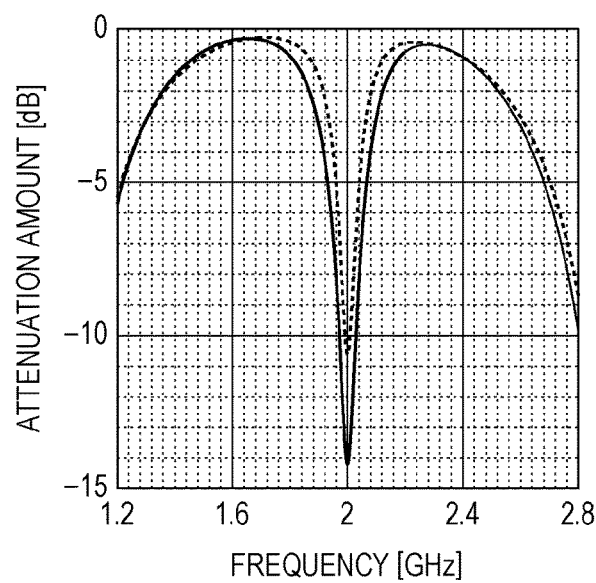

[Fig. 7A]
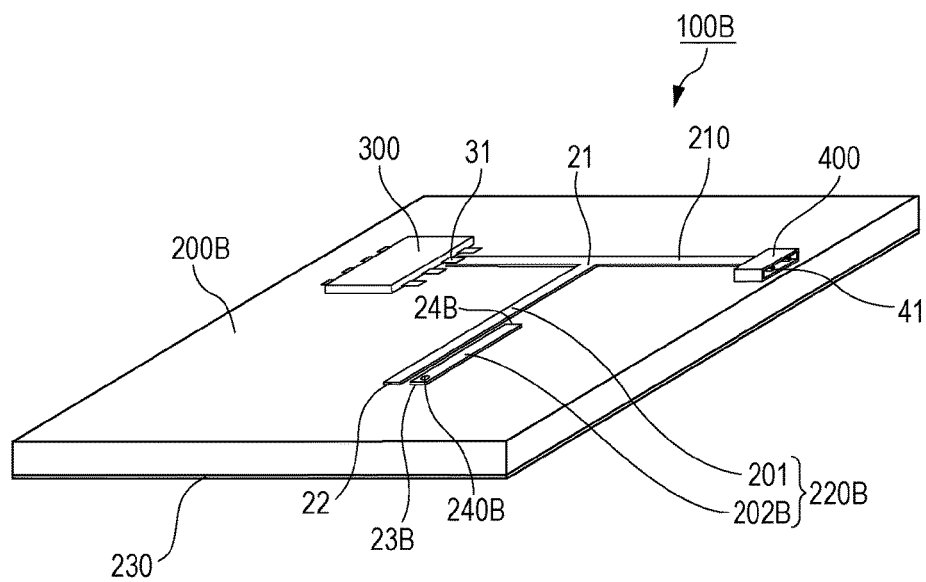
[Fig. 7B]
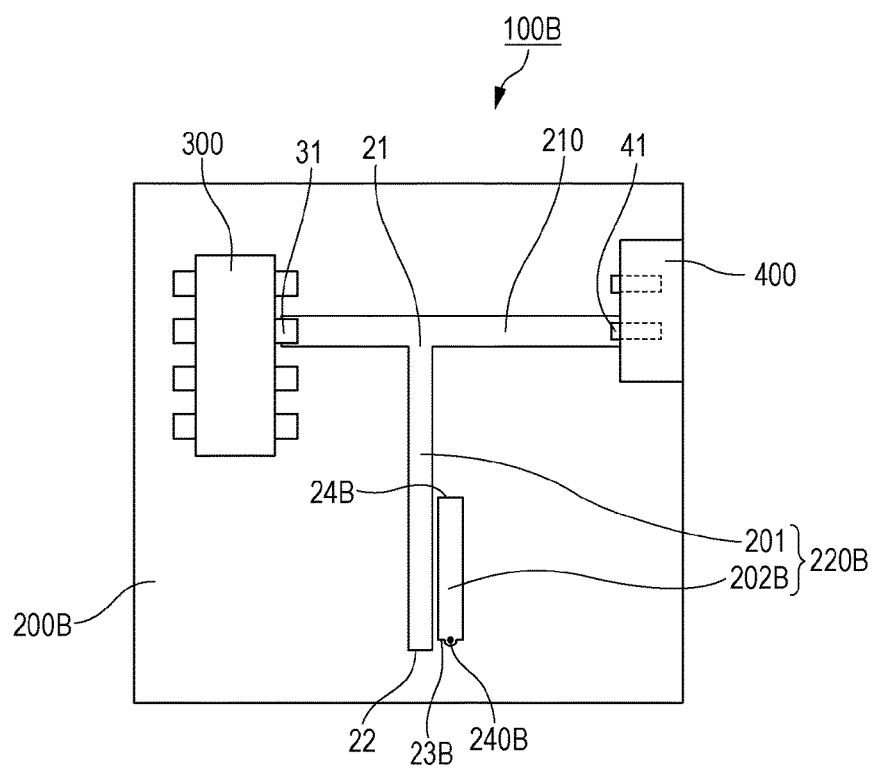

[Fig. 8A]
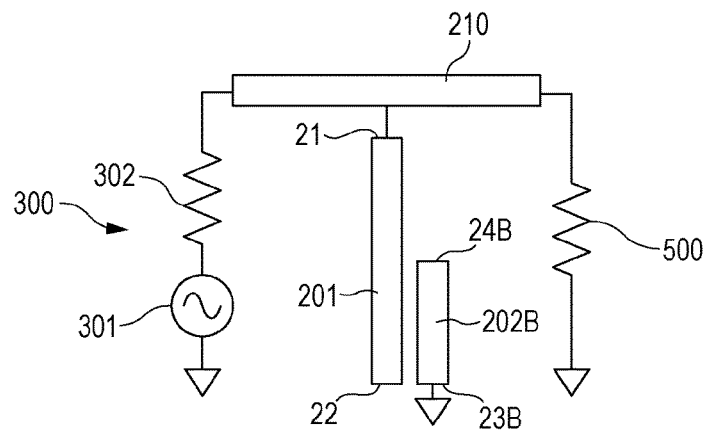
[Fig. 8B]
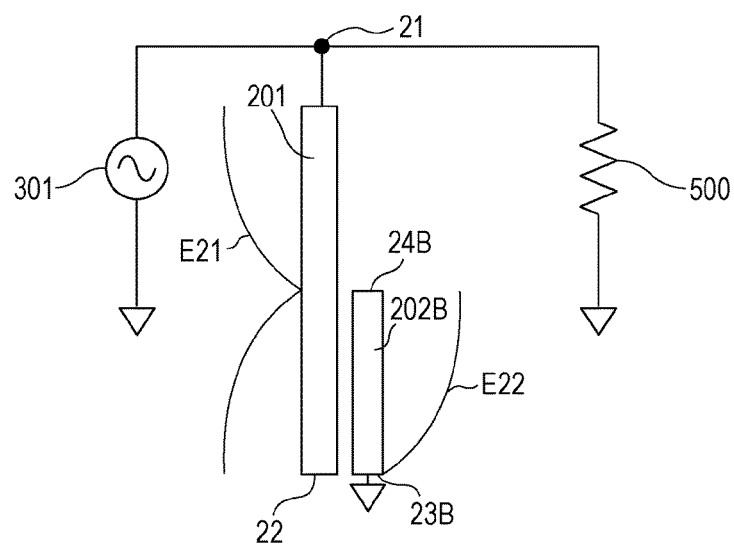

[Fig. 9A]
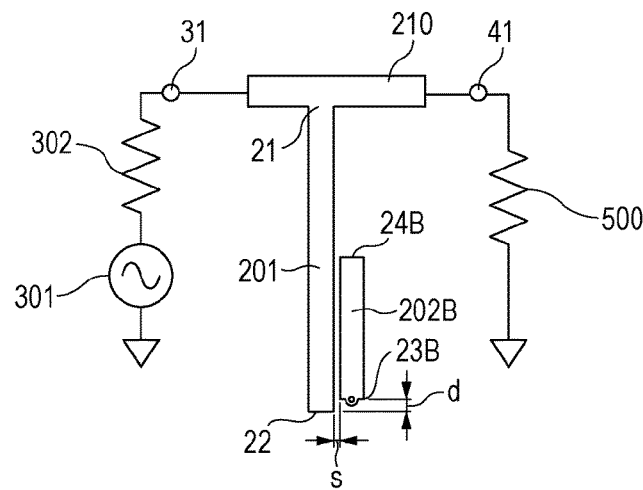
[Fig. 9B]
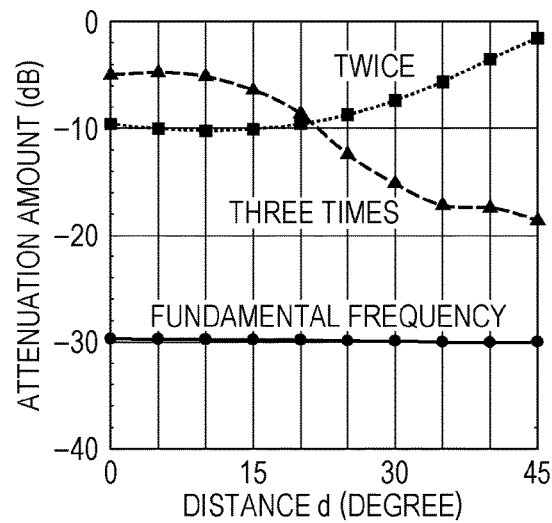

[Fig. 10A]
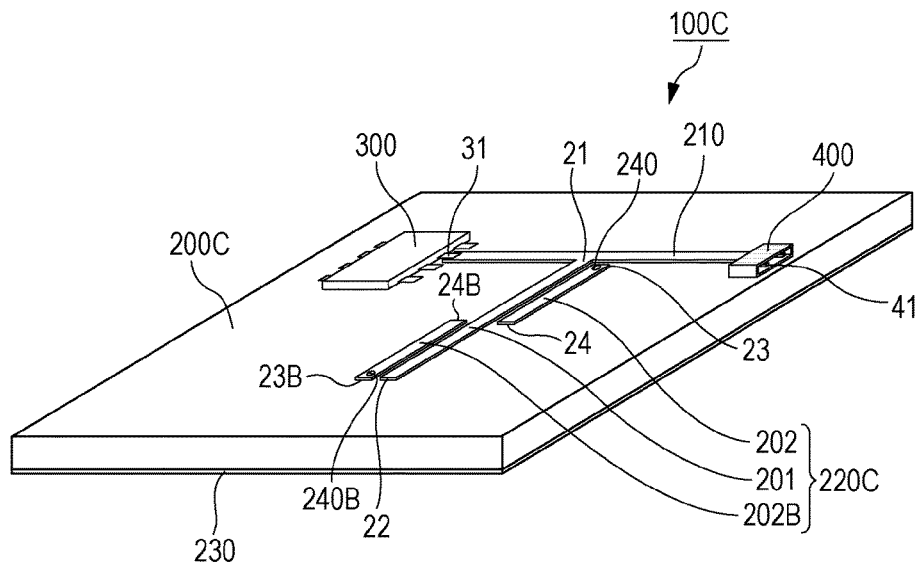
[Fig. 10B]
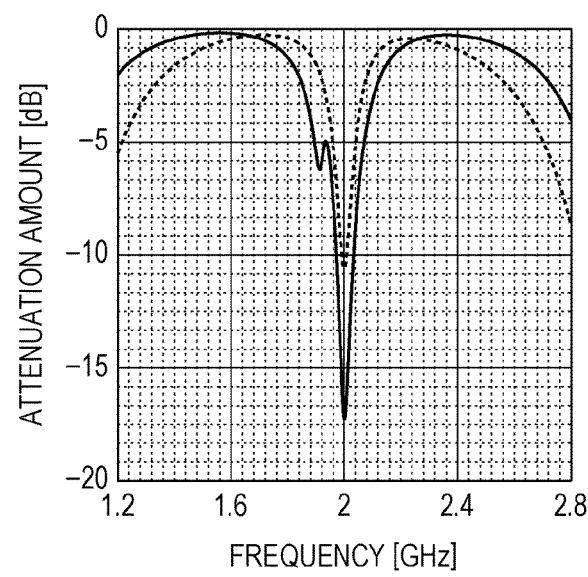

[Fig. 11]
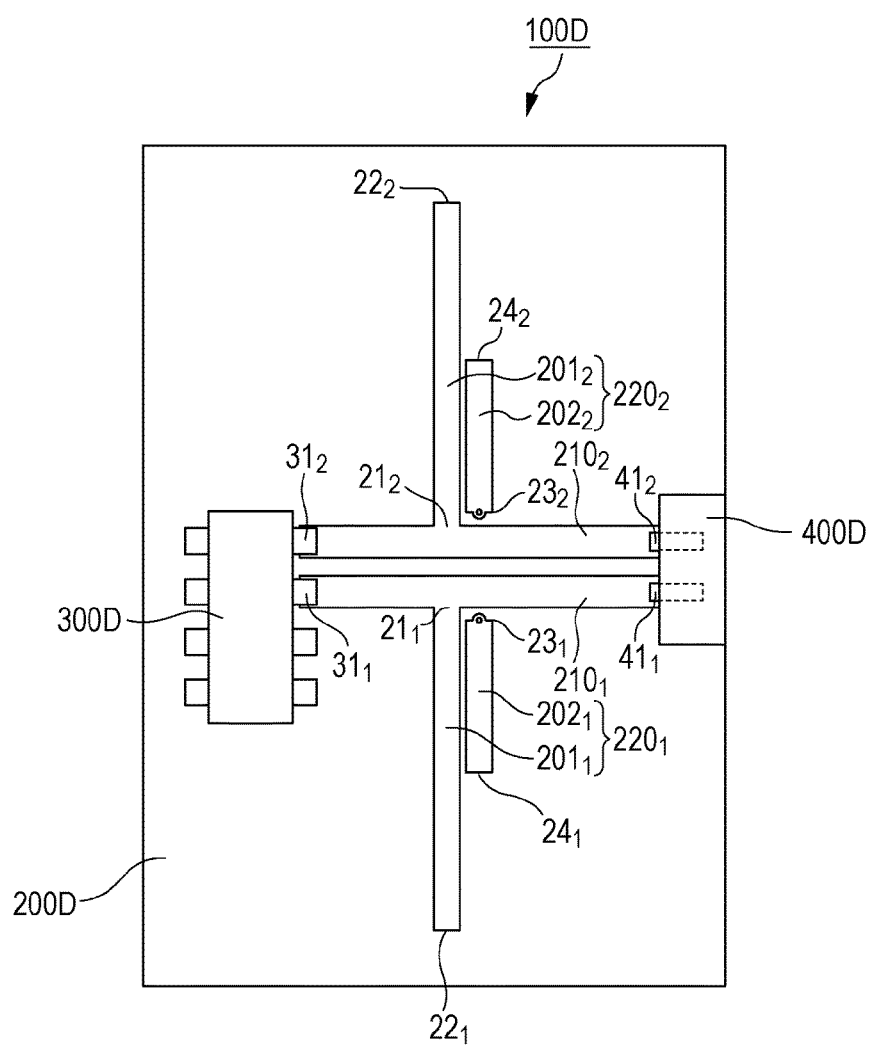

[Fig. 12]
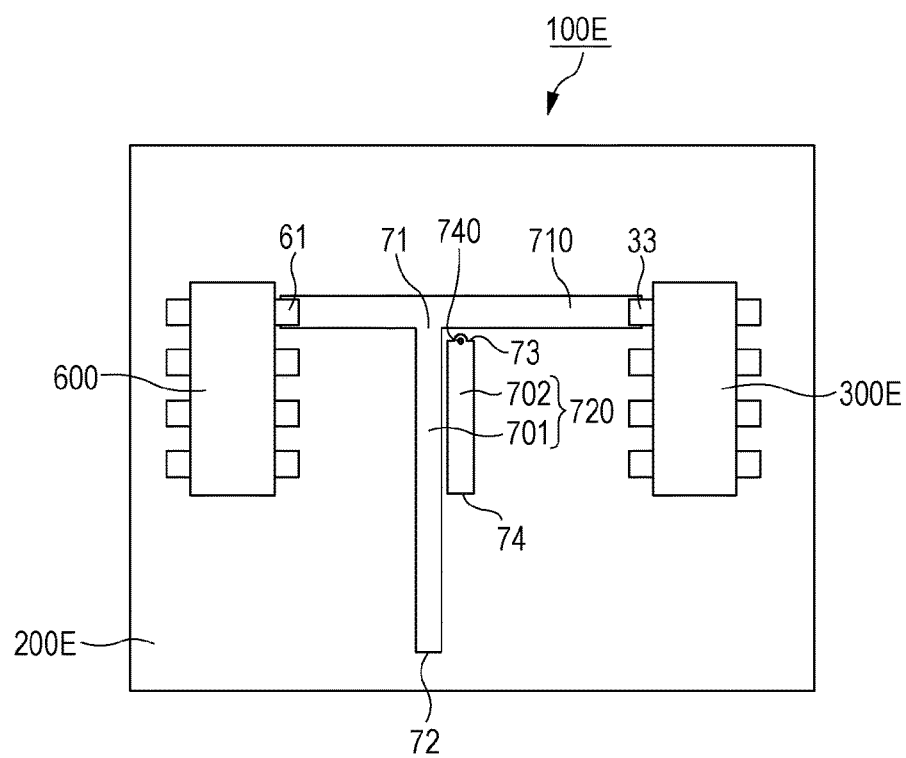

PRINTED CIRCUIT BOARD FOR TRANSMITTING DIGITAL SIGNALS

TECHNICAL FIELD

The present invention relates to a printed circuit board which is mounted on electric apparatuses or electronic apparatuses and which includes a printed wiring board having a transmission line used to transmit digital signals.

BACKGROUND ART

In recent years, there is a demand for digital multifunction printers, digital cameras, and the like, attaining high speed and high color saturation, and therefore, a large number of digital signals are required to be transmitted at high speed. Accordingly, serial transmission capable of transmitting a large amount of data at high speed using a small number of transmission lines has been widely used.

In a serial transmission method, low-speed parallel signals such as data, addresses, and control lines are serialized and output to a transmission line as differential signals and the transmitted serial signals are deserialized on a reception side so that parallel signals are obtained. A clock signal is embedded in a row of the serialized data to be transmitted, and the clock signal and the data are reproduced on the reception side.

When a high-speed signal is transmitted to a long lossy transmission line such as a cable, a portion of a component of the signal may be emitted from the cable serving as an antenna, and as a result, operations of other apparatuses may be affected. Therefore, electromagnetic interference (EMI) by the apparatus should be controlled.

In a clock-embedded type serial transmission, data and a synchronous clock are simultaneously serialized and data which is coded such that a logical rate of transition between a high level and a low level becomes 50 percent is transmitted. Therefore, a low level or a high level of a transmitted serial signal does not consecutively appear in a plurality of bits but repetition waveforms in a basic cycle of one bit mainly appear. Accordingly, strong EMI from a serial transmission system is observed at timings of integral multiples of one-bit cycle of the serial signal. Furthermore, a spectrum of the serial signal to be transmitted by a rectangular wave is represented by a sinc function, and it is known that a frequency of an integral multiple of one-bit cycle does not have a spectrum. Specifically, the EMI is generated in frequencies which do not include a spectrum of a transmission signal.

To suppress the generation of the EMI, a band elimination filter or a notch filter which includes a lumped parameter circuit including lumped parameter elements such as coil elements or capacitor elements may be used. In this case, since the filter is constituted by the lumped parameter element, a component element value is considerably small in a high frequency region such as a GHz band, and accordingly, it is difficult to obtain a desired cutoff frequency when a standard component is used.

Here, PTL1 discloses a band elimination filter constituted by a distributed constant circuit. In this case, an open stub having an electrical length of ¼ wavelength relative to a fundamental frequency is connected to a line (power supply line) connected to an LSI serving as a noise source so as to attenuate noise of frequencies of odd multiples of the fundamental frequency. Furthermore, to attenuate frequencies of even multiples of the fundamental frequency, e.g., a frequency of twice the fundamental frequency, PTL 1 discloses additional connection of an open stub of ¼ wavelength for the frequency of twice the fundamental frequency.

CITATION LIST

Patent Literature

PTL 1: Japanese Patent Laid-Open No. 2011-160428

SUMMARY OF INVENTION

Technical Problem

In the related art disclosed in PTL1, the open stub having the electrical length of ¼ wavelength relative to the fundamental frequency and the open stub having an electrical length of ¼ wavelength relative to a frequency of twice the fundamental frequency are disposed.

However, as a gap between the stubs becomes small, electric coupling between the stubs is increased, and therefore, attenuation of the frequency of twice the fundamental frequency is not attained. Alternatively, resonance frequencies of the stubs are shifted from each other, and accordingly, desired attenuation is not attained.

Accordingly, there arises a problem in that, although the gap between the stubs should be large to some extent so that an adverse effect caused by the coupling between the stubs is eliminated, an occupation region (area) of a band elimination filter constituted by the two stubs becomes large and a printed wiring board becomes large.

Accordingly, the present invention provides a printed circuit board capable of suppressing the EMI while increase in a size of the printed wiring board is avoided.

Solution to Problem

A printed circuit board according to the present invention includes a printed wiring board and a transmission circuit implemented on the printed wiring board and configured to transmit digital signals. The printed wiring board includes a main wiring pattern which is connected to the transmission circuit and which transmits the digital signals, a first wiring pattern having one end serving as a connection end connected to the main wiring pattern and the other end serving as an open end which is open, and a second wiring pattern which has one end serving as a grounded end which is grounded and the other end serving as an open end which is open and which extends in a direction in which the first wiring pattern extends. The second wiring pattern is disposed such that the grounded end of the second wiring pattern is disposed adjacent to the connection end or the open end of the first wiring pattern.

Further features of the present invention will become apparent from the following description of exemplary embodiments with reference to the attached drawings.

BRIEF DESCRIPTION OF DRAWINGS

FIG. 1A is a diagram schematically illustrating a configuration of a printed circuit board according to a first embodiment of the present invention.

FIG. 1B is a diagram schematically illustrating the configuration of the printed circuit board according to the first embodiment of the present invention.

FIG. 2A is a diagram illustrating principle of a band elimination filter of the printed circuit board according to the first embodiment of the present invention.

FIG. 2B is a diagram illustrating the principle of the band elimination filter of the printed circuit board according to the first embodiment of the present invention.

FIG. 2C is a diagram illustrating the principle of the band elimination filter of the printed circuit board according to the first embodiment of the present invention.

FIG. 3A is a diagram illustrating a simulation model of the printed circuit board according to the first embodiment of the present invention.

FIG. 3B is a diagram illustrating simulation results of the printed circuit board according to the first embodiment of the present invention.

FIG. 3C is a diagram illustrating simulation results of the printed circuit board according to the first embodiment of the present invention.

FIG. 4A is a diagram illustrating a simulation result of the printed circuit board according to the first embodiment of the present invention.

FIG. 4B is a diagram illustrating a simulation result of the printed circuit board according to the first embodiment of the present invention.

FIG. 5 is a diagram schematically illustrating a printed circuit board according to a second embodiment of the present invention.

FIG. 6A is a diagram illustrating a simulation model of the printed circuit board according to the second embodiment of the present invention.

FIG. 6B is a diagram illustrating simulation results of the printed circuit board according to the second embodiment of the present invention.

FIG. 7A is a diagram schematically illustrating a configuration of a printed circuit board according to a third embodiment of the present invention.

FIG. 7B is a diagram schematically illustrating the configuration of the printed circuit board according to the third embodiment of the present invention.

FIG. 8A is a diagram illustrating principle of a band elimination filter of the printed circuit board according to the third embodiment of the present invention.

FIG. 8B is a diagram illustrating principle of a band elimination filter of the printed circuit board according to the third embodiment of the present invention.

FIG. 9A is a diagram illustrating a simulation model of the printed circuit board according to the third embodiment of the present invention.

FIG. 9B is a diagram illustrating simulation results of the printed circuit board according to the third embodiment of the present invention.

FIG. 10A is a diagram illustrating a simulation model of a printed circuit board according to a fourth embodiment of the present invention.

FIG. 10B is a diagram illustrating simulation results of the printed circuit board according to the fourth embodiment of the present invention.

FIG. 11 is a diagram schematically illustrating a printed circuit board according to a fifth embodiment of the present invention.

FIG. 12 is a diagram schematically illustrating a configuration of a printed circuit board according to a sixth embodiment of the present invention.

DESCRIPTION OF EMBODIMENTS

Hereinafter, embodiments of the present invention will be described in detail with reference to the accompanying drawings.

First Embodiment

FIG. 1A is a perspective view illustrating a printed circuit board and FIG. 1B is a plan view illustrating the printed circuit board. A printed circuit board 100 illustrated in FIGS. 1A and 1B is mounted on an electric apparatus or an electronic apparatus not illustrated. The printed circuit board 100 includes a printed wiring board 200, a transmission circuit 300 implemented on the printed wiring board 200, and a connector 400 implemented on the printed wiring board 200.

The printed wiring board 200 has a multilayer structure (two layers in this embodiment). The transmission circuit 300 and the connector 400 are implemented on one of the layers, that is, a first surface layer, and a ground pattern 230 which is a conductor pattern is disposed on the other of the layers, that is, a second surface layer. The ground pattern 230 is grounded in a metallic case or the like, not illustrated, of the electric apparatus or the electronic apparatus, for example. In the first surface layer, a power source pattern, a ground pattern, and other signal patters, and the like are omitted.

The transmission circuit 300 which transmits digital signals at a predetermined transmission rate [bps] in a single end method is configured by a semiconductor package, for example, and includes a transmission terminal 31. Specifically, digital signals are transmitted from the transmission terminal 31.

A frequency corresponding to the transmission rate of digital signals is a fundamental frequency (repetitive frequency) [Hz]. When a transmission rate of digital signals is 1 [Gbps], a fundamental frequency of digital signals is 1 [GHz]. In other words, the fundamental frequency corresponds to a cycle of one bit.

A cable used to transmit digital signals to a reception circuit, not illustrated, is connected to the connector 400.

The printed wiring board 200 includes a main wiring pattern 210 which is formed by a conductor pattern and which serves as a transmission line of digital signals. A first end of the main wiring pattern 210 is connected to the transmission terminal 31 of the transmission circuit 300 and a second end is connected to a terminal 41 of the connector 400.

A digital signal transmitted from the transmission circuit 300 to the main wiring pattern 210 may include, in addition to a signal component representing a data signal, a noise component generated in the transmission circuit 300 and an externally-input noise component. The signal component does not have a spectrum in frequencies of integral multiples of the fundamental frequency whereas the noise component has a high peak in frequencies of integral multiples of the fundamental frequency. Therefore, in this embodiment, the printed wiring board 200 includes a band elimination filter (hereinafter, simply referred to as a "filter") 220 which attenuates components of frequencies of integral multiples of the fundamental frequency. The filter 220 includes wiring patterns 201 and 202 which are conductor patterns of the printed wiring board 200 and constitutes a distributed constant circuit. The filter 220 is formed on the first surface layer of the printed wiring board 200.

One end (connection end 21) of the wiring pattern 201 serving as a first wiring pattern is connected to the main wiring pattern 210 and the other end (open end 22) is open. Furthermore, one end (grounded end 23) of the wiring pattern 202 serving as a second wiring pattern is grounded, the other end (open end 24) is open, and the wiring pattern 202 extends in a direction in which the wiring pattern 201 extends (longitudinal direction).

The wiring pattern 202 is not in contact with the wiring patterns 201 and 210 and is disposed separately from the wiring pattern 201 by a distance enabling the wiring patterns 201 and 202 to be electrically connected to each other. The grounded end 23 of the wiring pattern 202 is connected to the ground pattern 230 through a through hole 240.

The wiring pattern 202 is disposed such that the grounded end 23 is disposed adjacent to the connection end 21 or the open end 22 of the wiring pattern 201. In the first embodiment, the grounded end 23 is disposed adjacent to the connection end 21. The grounded end 23 is disposed adjacent to the connection end 21 within a range of a gap in which the wiring pattern 202 is electromagnetically connected to the wiring pattern 201, that is, generally a range of a gap of approximately 0.1 [mm] inclusive to 1.0 [mm] inclusive.

A line length from the connection end 21 to the open end 22 of the wiring pattern 201 is set such that a voltage attenuation effect is obtained in frequencies of odd multiples of the fundamental frequency of digital signals. Specifically, a length of the wiring pattern 201 is set so as to be shifted from an electrical length of ¼ wavelength relative to the fundamental frequency of digital signals or an electrical length of ¼ wavelength in a range in which the voltage attenuation effect is attained. The fundamental frequency of digital signals is a frequency corresponding to a cycle of one bit and may be measured by a clock signal frequency reproduced from a digital signal.

A line length from the grounded end 23 (from the center position of the through hole 240 in this embodiment) to the open end 24 of the wiring pattern 202 is set such that a voltage attenuation effect is attained for frequencies of even multiples of the fundamental frequency of digital signals. Specifically, the length of the wiring pattern 202 is set so as to be shifted from an electrical length of ⅛ wavelength relative to the fundamental frequency or an electrical length of ⅛ wavelength in a range in which the voltage attenuation effect is attained.

Note that the wiring patterns 201 and 202 are preferably formed as straight line patterns but the wiring patterns 201 and 202 may be formed as patterns of a bent shape.

Furthermore, the weaker electrical coupling between the main wiring pattern 210 and the wiring pattern 201 is, the better. Although the wiring pattern 201 is preferably connected to the main wiring pattern 210 in an orthogonal manner, any connection may be made as long as the wiring pattern 201 is connected to the main wiring pattern 210 in an intersecting manner. Specifically, an angle of intersection between the main wiring pattern 210 and the wiring pattern 201 may be shifted from 90 degrees in a range in which influence of electrical coupling between the main wiring pattern 210 and the wiring pattern 201 is tolerated.

Furthermore, although the wiring patterns 201 and 202 are preferably disposed in parallel to each other so that electrical coupling between the wiring patterns 201 and 202 is uniformed, the wiring patterns 201 and 202 may be disposed slightly out of the parallel state. Specifically, the wiring patterns 201 and 202 may be disposed out of the parallel state as long as the electrical coupling between the wiring patterns 201 and 202 is sufficiently attained. That is, the wiring patterns 201 and 202 are disposed in parallel to each other or are disposed substantially in parallel to each other.

Next, operation of the filter 220 configured as described above will be described with reference to FIGS. 2A to 2C.

In the description below, the wiring pattern 201 is a straight-line pattern which orthogonally intersects with the main wiring pattern 210, and the wiring pattern 202 is a straight-line pattern which extends in parallel to the wiring pattern 201. The wiring pattern 201 is a line having a line length from the connection end 21 to the open end 22 corresponding to an electrical length of ¼ wavelength (lambda/4: lambda represents a wavelength) relative to the fundamental frequency of digital signals. The wiring pattern 202 is a line having a line length from the grounded end 23 to the open end 24 corresponding to an electrical length of ⅛ wavelength (lambda/8) relative to the fundamental frequency of digital signals, that is, a line having an electrical length corresponding to half the electrical length of the wiring pattern 201. Note that, when the grounded end 23 is grounded using a via hole, the center of the via hole serves as the connection end 21.

FIG. 2A is a diagram schematically illustrating a configuration in which a reception circuit is added to the printed circuit board 100. FIG. 2B is a diagram illustrating a characteristic of frequencies of odd multiples of the fundamental frequency of digital signals, and FIG. 2C is a diagram illustrating a characteristic of frequencies of even multiples of the fundamental frequency of digital signals.

As illustrated in FIG. 2A, the transmission circuit 300 includes a signal source 301 and an internal resistor 302. The internal resistor 302 has an impedance value the same as that of the main wiring pattern 210. Furthermore, a load resistance 500 which is equivalent to the reception circuit is connected to the second end of the main wiring pattern 210.

In this embodiment, a case where a transmission rate of digital signals is 1 [Gbps], that is, the fundamental frequency is 1 [GHz], will be described as an example.

As illustrated in FIG. 2B, a standing wave is generated for voltage of frequencies of odd multiples of the fundamental frequency in the wiring pattern 201 which is an open stub having an electrical length of lambda/4 relative to the fundamental frequency. Voltage distribution E1 is obtained for a signal component of the fundamental frequency whereas voltage distribution E3 is obtained for a signal component of three times the fundamental frequency.

Voltage becomes maximum at the open end 22 of the wiring pattern 201 and becomes minimum at the connection end 21 which is separate from the open end 22 by an electrical length of lambda/4. This is because, in the connection end 21, impedance for the fundamental frequency becomes minimum and signal components of the fundamental frequency which are to be supplied to a load resistance 500 are reduced. Specifically, the wiring pattern 201 attenuates signal components of 1 [GHz], 3 [GHz], 5 [GHz], and so on which are frequencies of odd multiples of the fundamental frequency of digital signals which passes the main wiring pattern 210.

Next, as illustrated in FIG. 2C, a standing wave of voltage distribution E21 in which voltage becomes maximum at the connection end 21 and the open end 22 relative to a frequency of twice the fundamental frequency is generated in the wiring pattern 201. At the connection end 21, impedance becomes maximum relative to the frequency of twice the fundamental frequency. Accordingly, attenuation of a voltage component of the frequency of twice the fundamental frequency in the wiring pattern 201 is considerably small.

Meanwhile, a standing wave of a voltage distribution E22 in which voltage becomes minimum at the grounded end 23 and voltage becomes maximum at the open end 24 is generated relative to the frequency of twice the fundamental frequency due to electrical coupling between the wiring patterns 201 and 202. The voltage distribution E22 has a waveform the same as that of impedance distribution.

Since the grounded end 23 is disposed adjacent to the connection end 21, unlike the voltage distribution E21, the voltage distribution E22 acts such that impedance at the connection end 21 is reduced and attenuates voltage components of frequencies of even multiples of the fundamental frequency, and in particular, a voltage component of a frequency of twice the fundamental frequency.

By this, a signal component (digital signal) required to be transmitted may be transmitted through the main wiring pattern 210 while attenuation of the signal component is negligible whereas a signal component (noise component) of an integral multiple of the fundamental frequency which is not to be transmitted may be attenuated by the filter 220. Consequently, EMI may be suppressed.

Furthermore, since the wiring pattern 201 and the wiring pattern 202 are disposed adjacent to each other, a region (occupation area) in which the filter 220 occupies in the printed wiring board 200 may be reduced and a size of the printed wiring board 200 may be reduced.

Example 1

Next, a result of simulation with the configuration described above will be described with reference to FIGS. 3A to 3C. An amount of shift (distance) of the grounded end 23 of the wiring pattern 202 relative to the connection end 21 of the wiring pattern 201 in a longitudinal direction is denoted by d and a gap (distance) between the wiring patterns 201 and 202 in a direction orthogonal to the longitudinal direction is denoted by s. FIG. 3A is a diagram illustrating a simulation model in which a reception circuit is added to the printed circuit board 100. FIG. 3B is a graph representing results of simulation of attenuation amounts of the fundamental frequency, a frequency of twice the fundamental frequency, and a frequency of three times the fundamental frequency which are obtained when the distance s is a constant value and the distance d is changed. FIG. 3C is a graph representing results of simulation of attenuation amounts of the fundamental frequency, a frequency of twice the fundamental frequency, and a frequency of three times the fundamental frequency which are obtained when the distance d is a constant value and the distance s is changed.

Calculation is performed for the three types of frequency in terms of an S parameter (S21) between a terminal (port) 31 and a terminal (port) 41 illustrated in FIG. 3A using a SPICE system circuit analysis tool as simulation.

The distance d is represented by an electrical angle (a unit of the electrical angle is degree) relative to the fundamental frequency. When the fundamental frequency is 1 [GHz] and an FR-4 substrate including the printed wiring board 200 having a thickness of 0.8 [mm] is used, an electrical angle of 15 degrees corresponds to approximately 7 [mm]. Note that the distance s between the wiring patterns 201 and 202 obtained when the simulation results of FIG. 3B are calculated is 0.2 [mm]. According to FIG. 3B, when the distance d corresponds to an electrical angle of 30 degrees or less, attenuation equal to or larger than 6 [dB] is obtained in the frequency of twice the fundamental frequency. Specifically, the smaller the distance d is, the larger attenuation amounts relative to the frequencies of even multiples (especially twice) of the fundamental frequency become. Furthermore, when the distance d corresponds to an electrical angle of 30 degrees or less, attenuation of 6 [dB] or more is obtained, which is further effective.

Furthermore, the distance d obtained when the simulation results are calculated as illustrated in FIG. 3C corresponds to an electrical angle of 5 degrees. When the distance s is equal to or smaller than 0.5 [mm], attenuation equal to or larger than 6 [dB] is obtained relative to the frequency of twice the fundamental frequency. Specifically, the smaller the distance s is, the larger attenuation amounts relative to frequencies of even multiples (especially twice) of the fundamental frequency become. Furthermore, when the distance s is equal to or smaller than 0.5 [mm], attenuation of 6 [dB] or more is obtained, which is further effective.

FIG. 4A is a graph illustrating a result of simulation of an attenuation amount of a signal corresponding to a fundamental frequency of 1 [GHz] in a case where a line length of the wiring pattern 201 is shifted from an electrical length of lambda/4. FIG. 4B is a graph illustrating a result of simulation of an attenuation amount of a signal corresponding to the frequency of twice the fundamental frequency of 2 [GHz] in a case where the line length of the wiring pattern 201 corresponds to an electrical length of lambda/4 and a line length of the wiring pattern 202 is shifted from an electrical length of lambda/8.

As illustrated in FIG. 4A, when the electrical length from the connection end 21 to the open end 22 of the wiring pattern 201 is within a range of plus or minus 10 percent relative to ¼ wavelength of the fundamental frequency corresponding to a transmission rate of digital signals, an amount of attenuation of noise of the fundamental frequency of 10 [dB] or more is obtained. Specifically, even when the electrical length from the connection end 21 to the open end 22 of the wiring pattern 201 is shifted from the ¼ wavelength within a range of plus or minus 10 percent, the amount of attenuation of noise of the fundamental frequency of 10 [dB] or more is obtained. Accordingly, when the electrical length of the wiring pattern 201 is set within the range of plus or minus 10 percent of the ¼ wavelength, noise may be more efficiently reduced and the EMI may be more efficiently suppressed.

As illustrated in FIG. 4B, when the electrical length of the wiring pattern 201 is ¼ wavelength and when the electrical length of the wiring pattern 202 is within a range of plus or minus 1.5 percent relative to ⅛ wavelength of the fundamental frequency, an amount of attenuation of noise of the frequency of twice the fundamental frequency of 6 [dB] or more is obtained. Specifically, even when the electrical length from the connection end 23 to the open end 24 of the wiring pattern 202 is shifted within a range of plus or minus 1.5 percent relative to half an electrical length of the wiring pattern 202, the amount of attenuation of noise of the frequency of twice the fundamental frequency of 6 [dB] or more is obtained. Accordingly, when the electrical length of the wiring pattern 202 is set within the range of plus or minus 1.5 percent of the half an electrical length of the wiring pattern 201, noise may be more efficiently reduced and the EMI may be more efficiently suppressed.

Second Embodiment

Next, a printed circuit board according to a second embodiment of the present invention will be described with reference to FIG. 5. In the second embodiment, components the same as those of the first embodiment are denoted by reference numerals the same as those of the first embodiment and descriptions thereof are omitted.

In the first embodiment above, the case where the wiring pattern 202 serving as the second wiring pattern is disposed on one side of the wiring pattern 201 is described. In the second embodiment, a printed wiring board 200A of a printed circuit board 100A includes a filter 220A having a configuration different from the filter 220 of the first embodiment. Specifically, the filter 220A includes a wiring pattern 201 having a configuration the same as that of the wiring pattern 201 of the first embodiment and two wiring patterns 202 serving as second wiring patterns which are disposed on opposite sides of the wiring pattern 201. The wiring patterns 202 have a configuration the same as that of the wiring pattern 202 of the first embodiment.

FIG. 6A is a diagram schematically illustrating a configuration in which a reception circuit is added to the printed circuit board 100A. FIG. 6B is a graph illustrating an attenuation characteristic of a frequency of twice the fundamental frequency in the filter 220A. In FIG. 6B, a dotted line denotes a characteristic obtained in a case where the wiring pattern 202 is disposed on one side of the wiring pattern 201 and a solid line denotes a characteristic obtained in a case where the wiring patterns 202 are disposed on opposite sides of the wiring pattern 201. Attenuation obtained when the wiring patterns 202 are disposed on the opposite sides of the wiring pattern 201 is larger than attenuation obtained when the wiring pattern 202 is disposed on one side by 3 [dB] or more. Accordingly, a signal component (noise component) of frequencies of even multiples of the fundamental frequency may be more efficiently attenuated and EMI may be more efficiently suppressed when compared with the first embodiment.

Third Embodiment

Next, a printed circuit board according to a third embodiment of the present invention will be described with reference to FIGS. 7A and 7B. FIG. 7A is a perspective view of the printed circuit board and FIG. 7B is a plan view of the printed circuit board. In the third embodiment, components the same as those of the first embodiment are denoted by reference numerals the same as those of the first embodiment and descriptions thereof are omitted.

In the third embodiment, a printed wiring board 200B of a printed circuit board 100B includes a band elimination filter (filter) 220B.

The filter 220B includes a wiring pattern 201 which is the same as the first wiring pattern 201 described in the first embodiment and a wiring pattern 202B serving as a second wiring pattern which is disposed differently from the wiring pattern 202 of the first embodiment.

The wiring pattern 202B has one end serving as a grounded end 23B which is grounded and the other end serving as an open end 24B which is open and extends in a direction in which the wiring pattern 201 extends (longitudinal direction).

The wiring pattern 202B is not in contact with the wiring pattern 201 and a wiring pattern 210 and is disposed separately from the wiring pattern 201 by a distance enabling the wiring patterns 201 and 202B to be electrically connected to each other. The grounded end 23B of the wiring pattern 202B is connected to a ground pattern 230 through a through hole 240B.

The wiring pattern 202B is disposed such that the grounded end 23B is disposed adjacent to a connection end 21 or an open end 22. In the third embodiment, the grounded end 23B is disposed adjacent to the open end 22.

A line length from the grounded end 23B (the center position of the through hole 240B in this embodiment) to the open end 24B of the wiring pattern 202B is set such that a voltage attenuation effect is attained for frequencies of even multiples of the fundamental frequency of digital signals. Specifically, a length of the wiring pattern 202B is set so as to be shifted from an electric length of ⅛ wavelength relative to the fundamental frequency of digital signals or ⅛ wavelength in a range in which the voltage attenuation effect is attained.

Note that the wiring patterns 201 and 202B are preferably formed as straight line patterns but the wiring patterns 201 and 202B may be formed as patterns of a bent shape.

Furthermore, although the wiring patterns 201 and 202B are preferably disposed in parallel to each other so that electrical coupling between the wiring patterns 201 and 202B is uniformed, the wiring patterns 201 and 202B may be disposed slightly out of the parallel state. Specifically, the wiring patterns 201 and 202B may be disposed out of the parallel state as long as the electrical coupling between the wiring patterns 201 and 202B is sufficiently attained. That is, the wiring patterns 201 and 202B are disposed in parallel to each other or are disposed substantially in parallel to each other.

Next, operation of the filter 220B configured as described above will be described with reference to FIGS. 8A and 8B. In the description below, the wiring pattern 201 having a straight form orthogonally intersects with the main wiring pattern 210, and the wiring pattern 202B having a straight form extends in parallel to the wiring pattern 201. A line length of a line from the connection end 21 to the open end 22 of the wiring pattern 201 corresponds to an electrical length of ¼ wavelength (lambda/4) relative to the fundamental frequency of digital signals. A line length of a line from the grounded end 23B to the open end 24B of the wiring pattern 202B corresponds to an electrical length of ⅛ wavelength (lambda/8) relative to the fundamental frequency of digital signals, that is, a line having an electrical length corresponding to half the electrical length of the wiring pattern 201.

FIG. 8A is a diagram schematically illustrating a configuration in which a reception circuit is added to the printed circuit board 100B. FIG. 8B is a diagram illustrating a characteristic of frequencies of even multiples of the fundamental frequency of digital signals.

As illustrated in FIG. 8A, a transmission circuit 300 includes a signal source 301 and an internal resistance 302 which has an impedance value the same as that of the main wiring pattern 210. Furthermore, a load resistance 500 which is equivalent to the reception circuit is connected to one end of the main wiring pattern 210.

In this embodiment, a case where a transmission rate of a digital signal is 1 [Gbps], that is, the fundamental frequency is 1 [GHz], will be described as an example.

Next, as illustrated in FIG. 8B, a standing wave of voltage distribution E21 in which voltage becomes maximum at the connection end 21 and the open end 22 relative to a frequency of twice the fundamental frequency is generated in the wiring pattern 201. At the connection end 21, impedance becomes maximum relative to the frequency of twice the fundamental frequency. Accordingly, attenuation of a voltage component of the frequency of twice the fundamental frequency in the wiring pattern 201 is considerably small.

On the other hand, a standing wave of voltage distribution E22 in which voltage becomes minimum at the grounded end 23B and voltage becomes maximum at the open end 24B is generated relative to the frequency of twice the fundamental frequency due to electrical coupling between the wiring pattern 201 and the wiring pattern 202B. The voltage distribution E22 has a waveform the same as that of impedance distribution.

The voltage distribution E22 on the wiring pattern 202B acts such that impedance at the open end 22 of the wiring pattern 201 is reduced. Specifically, since the grounded end 23B is disposed in the vicinity of the open end 22, the open end 22 serves as a node of the standing wave of a voltage waveform (the voltage is minimum) for the frequency of twice the fundamental frequency. As a result, the voltage distribution E22 acts so as to reduce impedance of the connection end 21 and attenuate the frequency of twice the fundamental frequency.

By this, signal components (digital signals) required to be transmitted may be transmitted to the main wiring pattern 210 while attenuation of the signal components is negligible whereas signal components (noise components) of integral multiples of the fundamental frequency which are not to be transmitted may be attenuated by the filter 220B. Consequently, EMI may be suppressed.

Furthermore, since the wiring patterns 201 and 202B are disposed adjacent to each other, a region (occupation area) in which the filter 220B occupies in the printed wiring board 200B may be reduced and a size of the printed wiring board 200B may be reduced.

Next, results of simulation performed with the configuration described above will be described with reference to FIGS. 9A and 9B. An amount of shift (distance) of the grounded end 23B of the wiring pattern 202B relative to the open end 22 of the wiring pattern 201 in a longitudinal direction is denoted by d and a gap (distance) between the wiring pattern 201 and the wiring pattern 202B in a direction orthogonal to the longitudinal direction is denoted by s.

Example 2

FIG. 9A is a diagram illustrating a simulation model in which a reception circuit is added to the printed circuit board 100B. FIG. 9B is a graph representing results of simulation of attenuation amounts of the fundamental frequency, a frequency of twice the fundamental frequency, and a frequency of three times the fundamental frequency which are obtained when the distance s is a constant value and the distance d is changed.

Calculation is performed for the three types of frequency in terms of an S parameter (S21) between a terminal (port) 31 and a terminal (port) 41 illustrated in FIG. 9A using a SPICE system circuit analysis tool as simulation.

The distance d is represented by an electrical angle (a unit of the electrical angle is degree) relative to the fundamental frequency. Note that a distance s between the wiring patterns 201 and 202B obtained when the simulation results of FIG. 9B are calculated is 0.2 [mm]. According to FIG. 9B, when the distance d corresponds to an electrical angle of 30 degrees or less, attenuation equal to or larger than 6 [dB] is obtained in the frequency of twice the fundamental frequency. Specifically, the smaller the distance d is, the larger attenuation amounts in frequencies of even multiples of the fundamental frequency (especially twice) become. Furthermore, with the distance d corresponding to an electrical angle of 30 degrees or less, attenuation of 6 [dB] or more is obtained, which is further effective.

Fourth Embodiment

Next, a printed circuit board according to a fourth embodiment of the present invention will be described with reference to FIGS. 10A and 10B. FIG. 10A is a perspective view of a printed circuit board and FIG. 10B is a graph representing an attenuation characteristic of a frequency of twice the fundamental frequency in a band elimination filter. In the fourth embodiment, components the same as those of the first to third embodiments are denoted by reference numerals the same as those of the first to third embodiments and descriptions thereof are omitted.

In the fourth embodiment, a printed wiring board 200C of a printed circuit board 100C includes a filter 220C having a configuration different from the filters of the first to third embodiments.

The filter 220C includes a wiring pattern 201 having a configuration the same as that of the wiring pattern 201 of the first embodiment and two wiring patterns 202 and 202B serving as second wiring patterns which are disposed on opposite sides of the wiring pattern 201. Specifically, the wiring pattern 202 having a configuration the same as that of the first embodiment and the wiring pattern 202B having a configuration the same as that of the third embodiment are disposed on the opposite sides of the wiring pattern 201.

An attenuation characteristic of a frequency of twice the fundamental frequency in this arrangement is illustrated in FIG. 10B. In FIG. 10B, a dotted line denotes an attenuation characteristic obtained in a case where only the wiring pattern 202 is disposed in a coupling manner and a solid line denotes an attenuation characteristic obtained in a case where the wiring patterns 202 and 202B are disposed on the opposite sides of the wiring pattern 201 in a coupling manner.

Attenuation obtained when the wiring patterns 202 and 202B are disposed on the opposite sides of the wiring pattern 201 is larger than attenuation obtained when the wiring pattern 202 is disposed on one side by 3 [dB] or more. Accordingly, signal components (noise components) of frequencies of even multiples of the fundamental frequency may be more efficiently attenuated and EMI may be more efficiently suppressed when compared with the first embodiment.

Fifth Embodiment

Next, a printed circuit board according to a fifth embodiment of the present invention will be described with reference to FIG. 11. In the first to fourth embodiments, the case where the transmission circuit 300 transmits digital signals in a single end method is described. However, in the fifth embodiment, a case where a transmission circuit transmits digital signals in a differential manner will be described.

A printed circuit board 100D includes a printed wiring board 200D, a transmission circuit 300D implemented on the printed wiring board 200D, and a connector 400D implemented on the printed wiring board 200D.

The printed wiring board 200D has a multilayer structure (two layers, for example). The transmission circuit 300D and the connector 400D are implemented on one of the layers, that is, a first surface layer, and a ground pattern (not illustrated) which is a conductor pattern is disposed on the other of the layers, that is, a second surface layer. The ground pattern is grounded in a metallic case or the like, not illustrated, of an electric apparatus or an electronic apparatus, for example. In the first surface layer, a power source pattern, a ground pattern, and other signal patters, and the like are omitted.

The transmission circuit 300D serving as a differential circuit which transmits digital signals at a predetermined transmission rate [bps] by a differential method is configured by a semiconductor package, for example, and includes a pair of transmission terminals $31_1$ and $31_2$. A digital signal is formed by a pair of differential signals and transmitted from the pair of transmission terminals $31_1$ and $31_2$.

A cable used to transmit digital signals to a reception circuit, not illustrated, is connected to the connector 400D.

The printed wiring board 200D includes a pair of main wiring patterns $210_1$ and $210_2$ which are formed by conductor patterns and which serve as transmission lines of digital signals.

One end of the main wiring pattern $210_1$ is connected to a transmission terminal $31_1$ of the transmission circuit 300D and the other end is connected to a terminal $41_1$ of the connector 400D. Similarly, one end of the main wiring pattern $210_2$ is connected to a transmission terminal $31_2$ of the transmission circuit 300D and the other end is connected to a terminal $41_2$ of the connector 400D. Specifically, the pair of main line patters $210_1$ and $210_2$ is connected to the transmission circuit 300D.

In the fifth embodiment, the printed wiring board 200D includes a pair of band elimination filters (filters) 220 which attenuate components of the frequencies of integral multiples of the fundamental frequency and which have a configuration the same as that of the first embodiment. Specifically, in the printed wiring board 200D, filters $220_1$ and $220_2$ are disposed for the main wiring patterns $210_1$ and $210_2$, respectively. Each of the filters $220_1$ and $220_2$ are configured by a distributed constant circuit formed by a conductor pattern of the printed wiring board 200D.

Specifically, the filters $220_1$ and $220_2$ include wiring patterns $201_1$ and $201_2$ serving as first wiring patterns, respectively. The wiring pattern $201_1$ has one end which is a connection end $21_1$ connected to the main wiring pattern $210_1$ and the other end which is an open end $22_1$ which is open. The wiring pattern $201_2$ has one end which is a connection end $21_2$ connected to the main wiring pattern $210_2$ and the other end which is an open end $22_2$ which is open. Furthermore, the filters $220_1$ and $220_2$ include wiring patterns $202_1$ and $202_2$ serving as second wiring patterns, respectively. The wiring pattern $202_1$ has one end which is a grounded end $23_1$ and the other end which is an open end $24_1$ which is open. The wiring pattern $202_2$ has one end which is a grounded end $23_2$ and the other end which is an open end $24_2$ which is open. Note that, as with the first embodiment, the grounded ends $21_3$ and $23_2$ are grounded while being connected to a ground pattern (not illustrated) in another layer by through holes.

The wiring patterns $202_1$ and $202_2$ are disposed such that the grounded ends $23_1$ and $23_2$ are disposed adjacent to the connection ends $21_1$ and $21_2$ or the open ends $22_1$ and $22_2$, respectively. In the fifth embodiment, the grounded ends $23_1$ and $23_2$ are disposed adjacent to the connection ends $21_1$ and $21_2$, respectively.

Here, although a differential signal (digital signal) output from the transmission circuit 300D is a normal mode signal, common mode noise may be generated due to unbalance of line lengths of the main wiring patterns $210_1$ and $210_2$, for example. As with the first embodiment, the common mode noise has a high peak in frequencies of integral multiples of the fundamental frequency of digital signals.

In the fifth embodiment, since the filters $220_1$ and $220_2$ are disposed for the main wiring patterns $210_1$ and $210_2$, respectively, the common mode noise may be reduced and EMI may be suppressed.

Note that the filters $220_1$ and $220_2$ of the fifth embodiment may have configurations the same as those of the filters of the second to fourth embodiment. Also in this case, the common mode noise may be reduced and the EMI may be suppressed.

Sixth Embodiment

Next, a printed circuit board according to a sixth embodiment of the present invention will be described with reference to FIG. 12. The noise described in the first to fifth embodiments may be generated in a power supply line. Although the case where the filters are employed in the main line patterns serving as transmission lines of digital signals is described in the first to fifth embodiments, a case where filters are employed in main power supply line patterns serving as power supply lines is described in the sixth embodiment.

A printed circuit board 100E illustrated in FIG. 12 is mounted on an electric apparatus or an electronic apparatus not illustrated. The printed circuit board 100E includes a printed wiring board 200E, a transmission circuit 300E implemented on the printed wiring board 200E, and a power supply circuit 600 implemented on the printed wiring board 200E.

The printed wiring board 200E has a multilayer structure (two layers in this embodiment). The transmission circuit 300E and the power supply circuit 600 are implemented in one of the layers, that is, a first surface layer, and a ground pattern (not illustrated) which is a conductor pattern is disposed in the other of the layers, that is, a second surface layer. The ground pattern is grounded in a metallic case or the like, not illustrated, of the electric apparatus or the electronic apparatus, for example. In the first surface layer, a ground pattern, signal patters, and the like are omitted.

The transmission circuit 300E which transmits digital signals at a predetermined transmission rate [bps] by a single end method (or a differential method) is configured by a semiconductor package, for example. Furthermore, the transmission circuit 300E is operated when a direct voltage is applied, and therefore, includes a power supply terminal 33 which accepts input of a direct voltage. The power supply circuit 600 includes a power supply terminal 61 which outputs a direct voltage.

The printed wiring board 200E includes a main power supply wiring pattern 710 which is formed by a conductor pattern and which serves as a power supply line of a direct voltage. One end of the main power supply wiring pattern 710 is connected to the power supply terminal 33 of the transmission circuit 300E and the other end is connected to the power supply terminal 61 of the power supply circuit 600.

In the sixth embodiment, the printed wiring board 200E includes a band elimination filter (hereinafter simply referred to as a "filter") 720 which attenuates components of frequencies of integral multiples of the fundamental frequency and which has a configuration the same as that of the filter 220 of the first embodiment. The filter 720 is configured by a distributed constant circuit formed by a conductor pattern of the printed wiring board 200E.

The filter 720 includes a wiring pattern 701 serving as a first power supply wiring pattern. The wiring pattern 701 has one end which is a connection end 71 connected to the main power supply wiring pattern 710 and the other end which is an open end 72 which is open. Furthermore, the filter 720 has a wiring pattern 702 serving as a second power supply wiring pattern. The wiring pattern 702 has one end which is a grounded end 73 which is grounded and the other end which is an open end 74 which is open and extends in a direction in which the wiring pattern 701 extends (longitudinal direction).

The wiring pattern 702 is not in contact with the wiring patterns 701 and 710 and is disposed separately from the wiring pattern 701 by a distance enabling the wiring patterns 701 and 702 to be electrically connected to each other. The grounded end 73 of the wiring pattern 702 is connected to a ground pattern (not illustrated) in another layer through a through hole 740.

The wiring pattern 702 is disposed such that the grounded end 73 is disposed adjacent to the connection end 71 or the open end 72 of the wiring pattern 701. In the sixth embodiment, the grounded end 73 is disposed adjacent to the connection end 71.

A line length from the connection end 71 to the open end 72 of the wiring pattern 701 is set such that a voltage attenuation effect is obtained in frequencies of odd multiples of the fundamental frequency of digital signals. Specifically, a length of the wiring pattern 701 is set so as to be shifted from an electric length of ¼ wavelength relative to the fundamental frequency of digital signals or ¼ wavelength in a range in which the voltage attenuation effect is attained.

A line length from the grounded end 73 (the center position of the through hole 740 in this embodiment) to the open end 74 of the wiring pattern 702 is set such that a voltage attenuation effect is attained relative to frequencies of even multiples of the fundamental frequency of digital signals. Specifically, a length of the wiring pattern 702 is set so as to be shifted from an electric length of ⅛ wavelength relative to the fundamental frequency or ⅛ wavelength in a range in which the voltage attenuation effect is attained.

Note that the wiring patterns 701 and 702 are preferably formed as straight line patterns but the wiring patterns 701 and 702 may be formed as patterns of a bent shape.

Furthermore, the weaker electrical connection between the main power supply wiring pattern 710 and the wiring pattern 701 is, the better. Although the wiring pattern 701 is preferably connected to the main power supply wiring pattern 710 in an orthogonal manner, any connection may be made as long as the wiring pattern 701 is connected to the main power supply wiring pattern 710 in an intersecting manner. Specifically, an angle of intersection between the main power supply wiring pattern 710 and the wiring pattern 701 may be shifted from 90 degrees in a range in which influence of electrical coupling between the main power supply wiring pattern 710 and the wiring pattern 701 is tolerated.

Furthermore, although the wiring patterns 701 and 702 are preferably disposed in parallel to each other so that electrical coupling between the wiring patterns 701 and 702 is uniformed, the wiring patterns 701 and 702 may be disposed slightly out of the parallel state. Specifically, the wiring patterns 701 and 702 may be disposed out of the parallel state as long as the electrical coupling between the wiring patterns 701 and 702 is sufficiently attained. That is, the wiring patterns 701 and 702 are disposed in parallel to each other or are disposed substantially in parallel to each other.

By this, a direct voltage is applied to the transmission circuit 300E through the main power supply wiring pattern 710 while attenuation of the direct voltage is negligible, noise components of frequencies of integer multiples of the fundamental frequency may be attenuated by the filter 720, and EMI may be suppressed.

Furthermore, since the wiring patterns 701 and 702 are disposed adjacent to each other, a region (occupation area) in which the filter 720 occupies in the printed wiring board 200E may be reduced and a size of the printed wiring board 200E may be reduced.

Furthermore, as with the first embodiment, when the electrical length of the wiring pattern 701 is within a range of plus or minus 10 percent relative to a ¼ wavelength of the fundamental frequency corresponding to a transmission rate of digital signals, an amount of attenuation of noise of the fundamental frequency of 10 [dB] or more is obtained. Specifically, even when the electrical length from the connection end 71 to the open end 72 of the wiring pattern 701 is shifted within a range of plus or minus 10 percent relative to the ¼ wavelength, the amount of attenuation of noise of the fundamental frequency of 10 [dB] or more is obtained. Accordingly, when the wiring pattern 701 is set within the range of plus or minus 10 percent of the electrical length of ¼ wavelength, noise may be more efficiently reduced and the EMI may be more efficiently suppressed.

Moreover, as with the first embodiment, when the electrical length of the wiring pattern 701 is ¼ wavelength and when the electrical length of the wiring pattern 702 is within a range of plus or minus 1.5 percent relative to ⅛ wavelength of the fundamental frequency, an amount of attenuation of noise of a frequency of twice the fundamental frequency of 6 [dB] or more is obtained. Specifically, even when the electrical length from the connection end 73 to the open end 74 of the wiring pattern 702 is shifted within a range of plus or minus 1.5 percent relative to the electrical length of half a wavelength of the wiring pattern 702, the amount of attenuation of noise of the fundamental frequency of 6 [dB] or more is obtained. Accordingly, when the electrical length of the wiring pattern 702 is set within the range of plus or minus 1.5 percent of the electrical length of half a wavelength of the wiring pattern 701, noise may be more efficiently reduced and the EMI may be more efficiently suppressed.

Note that the filter 720 may have a configuration the same as those of the filters 220A to 220C of the second to fourth embodiments. In this case, the noise may be efficiently reduced and the EMI may be efficiently suppressed.

Note that the present invention is not limited to the foregoing embodiments, and various modifications may be made within the scope of the invention by those who skilled in the art.

Although the case where the reception circuit is disposed separately from the printed wiring boards 200 to 200D is described in the first to fifth embodiments, the present invention is not limited to these and the reception circuit may be implemented in the printed wiring boards 200 to 200D.

Furthermore, although the case where the power supply circuit 600 is implemented in the printed wiring board 200E in the sixth embodiment, the present invention is not limited to this and the printed wiring board 200E may be connected to the power supply circuit 600 through a connecter implemented in the printed wiring board 200E.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-079105, filed Apr. 5, 2013 which is hereby incorporated by reference herein in its entirety.

The invention claimed is:

1. A printed circuit board comprising:
   a printed wiring board; and
   a transmission circuit implemented on the printed wiring board and configured to transmit digital signals,
   wherein the printed wiring board includes a main wiring pattern which is connected to the transmission circuit and which transmits the digital signals, a first wiring pattern having a connection end connected to the main wiring pattern and an open end which is open, and a second wiring pattern having a grounded end which is grounded and an open end which is open and extending in a direction in which the first wiring pattern extends, and the second wiring pattern is disposed such that the grounded end of the second wiring pattern is disposed such that the grounded end of the second wiring pattern is disposed adjacent to the open end of the first wiring pattern.

2. The printed circuit board according to claim 1, wherein a gap between the grounded end of the second wiring pattern and the open end of the first wiring pattern which is disposed adjacent to the grounded pattern of the second wiring pattern is in a range from 0.1 mm inclusive to 1.0 mm inclusive.

3. The printed circuit board according to claim 1, wherein an electrical length from the connection end to the open end of the first wiring pattern is within a range of plus or minus 10 percent relative to ¼ wavelength of a fundamental frequency of the digital signals.

4. The printed circuit board according to claim 1, wherein an electrical length from the grounded end to the open end of the second wiring pattern is within a range of plus or minus 1.5 percent relative to half the electric length of the first wiring pattern.

5. The printed circuit board according to claim 1, wherein the transmission circuit is a differential circuit which transmits a pair of differential signals as the digital signals and which is connected to a pair of the main wiring patterns, and the first wiring pattern and the second wiring pattern are disposed for each of the main wiring patterns.

6. The printed circuit board according to claim 1, wherein the second wiring pattern is disposed on opposite sides of the first wiring pattern.

7. A printed circuit board comprising:
a printed wiring board; and
a transmission circuit implemented on the printed wiring board and configured to transmit digital signals,
wherein the printed wiring board includes a main power supply wiring pattern which is connected to the transmission circuit and which transmits direct voltage to the transmission circuit, a first power supply wiring pattern having a connection end connected to the main power supply wiring pattern and an open end which is open, and a second power supply wiring pattern having a grounded end which is grounded and an open end which is open and extending in a direction in which the first power supply wiring pattern extends, and the second power supply wiring pattern is disposed such that the grounded end of the second power supply wiring pattern is disposed adjacent to the open end of the first power supply wiring pattern.

8. The printed circuit board according to claim 7, wherein a gap between the grounded end of the second power supply wiring pattern and the open end of the first power supply wiring pattern which is disposed adjacent to the grounded pattern of the second power supply wiring pattern is in a range from 0.1 mm inclusive to 1.0 mm inclusive.

9. The printed circuit board according to claim 7, wherein an electrical length from the connection end to the open end of the first power supply wiring pattern is within a range of plus or minus 10 percent relative to ¼ wavelength of a fundamental frequency of the digital signals.

10. The printed circuit board according to claim 7, wherein an electrical length from the grounded end to the open end of the second power supply wiring pattern is within a range of plus or minus 1.5 percent relative to half the electric length of the first power supply wiring pattern.

11. The printed circuit board according to claim 7, wherein the second power supply wiring pattern is disposed on opposite sides of the first power supply wiring pattern.

12. A printed circuit board comprising:
a printed wiring board; and
a transmission circuit implemented on the printed wiring board and configured to transmit digital signals,
wherein the printed wiring board includes a main wiring pattern which is connected to the transmission circuit and which transmits the digital signals, a first wiring pattern having a connection end connected to the main wiring pattern and an open end which is open, and two second wiring patterns disposed on opposite sides of the first wiring pattern each of which has a grounded end which is grounded and an open end which is open,
wherein the two second wiring patterns extend in a direction in which the first wiring pattern extends, and
wherein one of the second wiring patterns is disposed such that the grounded end of the one of the second wiring patterns is disposed adjacent to the connection end of the first wiring pattern and the other second wiring pattern is disposed such that the grounded end of the other second wiring patterns is disposed adjacent to the open end of the first wiring pattern.

13. The printed circuit board according to claim 12, wherein gaps between the grounded ends of the second wiring patterns and the open end of the first wiring pattern which is disposed adjacent to the grounded patterns of the second wiring patterns are in a range from 0.1 mm inclusive to 1.0 mm inclusive.

14. The printed circuit board according to claim 12, wherein an electrical length from the connection end to the open end of the first wiring pattern is within a range of plus or minus 10 percent relative to ¼ wavelength of a fundamental frequency of the digital signals.

15. The printed circuit board according to claim 12, wherein an electrical length from the grounded end to the open end of each of the second wiring patterns is within a range of plus or minus 1.5 percent relative to half the electric length of the first wiring pattern.

16. The printed circuit board according to claim 12, wherein the transmission circuit is a differential circuit which transmits a pair of differential signals as the digital signals and which is connected to a pair of the main wiring patterns, and the first wiring pattern and the second wiring patterns are disposed for each of the main wiring patterns.

17. A printed circuit board comprising:
a printed wiring board; and
a transmission circuit implemented on the printed wiring board and configured to transmit digital signals,
wherein the printed wiring board includes a main wiring pattern which is connected to the transmission circuit and which transmits the digital signals, a first wiring pattern having a connection end connected to the main wiring pattern and an open end which is open, and a second wiring pattern having a grounded end which is grounded and an open end which is open and extending in a direction in which the first wiring pattern extends, and the second wiring pattern is disposed such that the grounded end of the second wiring pattern is disposed adjacent to the connection end or the open end of the first wiring pattern,
wherein the second wiring pattern is arranged along the first wiring pattern, wherein an electrical length from the connection end to the open end of the first wiring pattern is within a range of plus or minus 10 percent relative to 1/4 wavelength of a fundamental frequency of the digital signals, and wherein an electrical length from the grounded end to the open end of the second wiring pattern is within a range of plus or minus 1.5 percent relative to half the electric length of the first wiring pattern.

18. A printed circuit board comprising:

a printed wiring board; and a transmission circuit implemented on the printed wiring board and configured to transmit digital signals, wherein the printed wiring board includes a main power supply wiring pattern which is connected to the transmission circuit and which transmits direct voltage to the transmission circuit, a first power supply wiring pattern having a connection end connected to the main power supply wiring pattern and an open end which is open, and the second power supply wiring pattern is disposed such that the grounded end of the second power supply wiring pattern is disposed adjacent to the connection end or the open end of the first power supply wiring pattern, wherein the second wiring pattern is arranged along the first wiring pattern, wherein an electrical length from the connection end to the open end of the first power supply wiring pattern is within a range of plus or minus 10 percent relative to 1/4 wavelength of a fundamental frequency of the digital signals, and wherein an electrical length from the grounded end to the open end of the second power supply wiring pattern is within a range of plus or minus 1.5 percent relative to half the electric length of the first power supply wiring pattern.

19. A printed circuit board comprising:

a printed wiring board; and a transmission circuit implemented on the printed wiring board and configured to transmit digital signals, wherein the printed wiring board includes a main wiring pattern which is connected to the transmission circuit and which transmits the digital signals, a first wiring pattern having one end serving as a connection end connected to the main wiring pattern and the other end serving as an open end which is open, and two second wiring patterns which are disposed on opposite sides of the first wiring pattern and each of which has one end serving as a grounded end which is grounded and the other end serving as an open end which is open and which extends in a direction in which the first wiring pattern extends, and the second wiring patterns are disposed such that the grounded end of the second wiring pattern are disposed adjacent to the connection end or the open end of the first wiring pattern, wherein both of the plurality of second wiring patterns are arranged along the first wiring pattern, wherein an electrical length from the connection end to the open end of the first wiring pattern is within a range of plus or minus 10 percent relative to 1/4 wavelength of a fundamental frequency of the digital signals, and wherein an electrical length from the grounded end to the open end of each of the second wiring patterns is within a range of plus or minus 1.5 percent relative to half the electric length of the first wiring pattern.

* * * * *